(12) United States Patent
Schwarzbauer

(10) Patent No.: US 6,175,148 B1
(45) Date of Patent: Jan. 16, 2001

(54) ELECTRICAL CONNECTION FOR A POWER SEMICONDUCTOR COMPONENT

(75) Inventor: Herbert Schwarzbauer, München (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/272,669

(22) Filed: Mar. 18, 1999

Related U.S. Application Data

(63) Continuation of application No. PCT/DE97/01754, filed on Aug. 14, 1997.

(30) Foreign Application Priority Data

Sep. 18, 1996 (DE) .............................................. 196 38 090

(51) Int. Cl.⁷ .......................... H01L 23/495; H01L 23/48
(52) U.S. Cl. ......................... 257/667; 257/669; 257/748
(58) Field of Search ................................... 257/674, 664, 257/748, 178, 747, 687, 688, 690, 693, 718

(56) References Cited

U.S. PATENT DOCUMENTS

| | | | |
|---|---|---|---|
| 3,519,896 | 7/1970 | Kelley ................................... | 257/754 |
| 3,620,692 | * 11/1971 | Franklin ............................... | 257/748 |
| 3,821,615 | * 6/1974 | Nordstrom et al. ................. | 257/669 |
| 3,902,148 | * 8/1975 | Drees et al. .......................... | 257/669 |
| 4,141,028 | * 2/1979 | Hulstrunk ............................ | 257/674 |
| 4,734,755 | * 3/1988 | Schierz ................................ | 257/674 |
| 4,881,117 | * 11/1989 | Gandolfi et al. ..................... | 257/669 |
| 4,893,172 | * 1/1990 | Matsumoto et al. ................. | 257/669 |
| 4,994,412 | 2/1991 | Kalfus et al. ........................ | 257/754 |

FOREIGN PATENT DOCUMENTS

| | | | |
|---|---|---|---|
| 513 934 | 9/1952 | (BE) | ..................... 257/674 |
| 25 41 121 A1 | 3/1977 | (DE) | ..................... 257/674 |
| 28 11 933 A1 | 9/1978 | (DE) | ..................... 257/674 |
| 34 06 420 A1 | 8/1984 | (DE) | ..................... 257/674 |
| 35 28 427 A1 | 4/1987 | (DE) | ..................... 257/674 |
| 0 155 473 A1 | * 9/1995 | (EP) | ..................... 257/674 |
| 2 135 824 | * 9/1984 | (GB) | ..................... 257/674 |
| 56-147459 | * 11/1981 | (JP) | ..................... 257/674 |
| 60-76153 | * 4/1985 | (JP) | ..................... 257/178 |

OTHER PUBLICATIONS

Japanese Patent Abstract No. 4–32256 (A) (Ueda), dated Feb. 4, 1992.
Japanese Patent Abstract No. 4–125957 (A) (Yamaguchi), dated Apr. 27, 1992.
Japanese Patent Abstract No. 04316358 (Keiro), dated Nov. 6, 1992.*
Japanese Patent Abstract No. 05315490 (Mitsuo), dated Nov. 26, 1993.*

* cited by examiner

*Primary Examiner*—Donald L. Monin, Jr.
(74) *Attorney, Agent, or Firm*—Herbert L. Lerner; Laurence A. Greenberg; Werner H. Stemer

(57) ABSTRACT

The power semiconductor component has a semiconductor body which is electrically supplied through a contact clip. A solder ball connects the semiconductor body to the contact clip. The contact clip has a meandering electrical supply to a solder land, into which the solder ball is inserted.

16 Claims, 2 Drawing Sheets

ELECTRICAL CONNECTION FOR A POWER SEMICONDUCTOR COMPONENT

CROSS-REFERENCE TO RELATED APPLICATION

This is a continuation of copending International Application PCT/DE97/01754, filed Aug. 14, 1997, which designated the United States.

BACKGROUND OF THE INVENTION

Field of the Invention

The invention relates to an electrical connection for a power semiconductor component, which is formed inside a baseplate region. The assembly comprises a semiconductor body, a contact clip and a soldered joint which connects the semiconductor body to the contact clip.

U.S. Pat. No. 3,519,896, for example, discloses an electrical connection without any solder, by means of metal clips, for a power semiconductor component. European patent disclosure EP 0 155 473 describes the use of firmly soldered contact clips to make contact with power semiconductor modules.

In power semiconductor components, an electrical supply to a semiconductor body is often formed by a copper layer which is applied on a ceramic substrate. The heat that is produced in the semiconductor body during the operation of the power semiconductor component is also dissipated via the copper layer. Owing to this one-sided heat dissipation and cooling and the temperature drop across the ceramic substrate, which is only a poor heat conductor, power semiconductor components reach their operating temperature in just a few seconds. This is particularly true when they are used in modular form with, for example, a plurality of power semiconductor components being arranged alongside one another.

The fact that the operating temperature is reached quickly means that the power semiconductor components are subject to large numbers of alternating load cycles in many applications, that is to say to a large number of heating and cooling processes. For example, more than 105 alternating load cycles may be reached per annum. Each heating and cooling process, that is to say each alternating load cycle, causes thermomechanical stresses in the power semiconductor component and its electrical supply leads. Large numbers of alternating load cycles can thus cause severe damage in the electrical supply leads on the semiconductor body.

Since the fatigue in the material caused by large numbers of alternating load cycles becomes less the better the coefficient of thermal expansion of the material of the electrical supplies is matched to the coefficient of thermal expansion of the semiconductor body, that is to say the coefficient of thermal expansion of silicon, and of the ceramic substrate, molybdenum or copper-plated Invar is often used as the material for the electrical supplies, and is respectively soldered to the semiconductor body or the ceramic substrate. The use of such materials is disclosed, for example, in the European patent disclosure EP 0 432 867. However, it has been found that there is always a residual mismatch, although this may be small, between the coefficients of thermal expansion of the various materials and, furthermore, mechanical stresses are caused by non-uniform heating of solder connections on the one hand and, particularly with modular construction, of the module base on the other hand. Together with the mechanical stresses, this mismatch leads to slow fatigue in the respective soldered joints between the semiconductor body or the ceramic substrate and electrical supplies.

SUMMARY OF THE INVENTION

It is accordingly an object of the invention to provide an electrical connection for a power semiconductor component which overcomes the above-mentioned disadvantages of the heretofore-known devices and methods of this general type and which suffers virtually no material fatigue, particularly at the soldered joints, even after large numbers of alternating load cycles.

With the foregoing and other objects in view there is provided, in accordance with the invention, an electrical connection for a power semiconductor component, comprising:

a baseplate, a semiconductor body disposed on the baseplate, and a contact clip with a soldered joint connected to the semiconductor body;

the soldered joint being formed as a small-area solder point between the semiconductor body and the contact clip; and the contact clip including at least one strain-relieving solder land carrying the small-area solder point, whereby the contact clip and the semiconductor body are thermally and mechanically decoupled from one another.

In accordance with an added feature of the invention, a meandering electrical supply connects the strain-relieving solder land to the contact clip.

In accordance with an additional feature of the invention, the electrical supply, the solder land, and the contact clip are formed from one and the same material.

In accordance with another feature of the invention, the electrical supply and the solder land are formed in a plane that is closer to the semiconductor body than the plane defined by the contact clip.

In accordance with a further feature of the invention, the contact clip is formed from a tri-layer bimetallic sheet or molybdenum.

In accordance with again an added feature of the invention, the contact clip is formed of a tri-layer bimetallic sheet with a layer sequence composed of materials A-B-A. In a preferred embodiment, the material A is copper and the material B is Invar.

In accordance with again an additional feature of the invention, a filling is provided between the contact clip and the semiconductor body. In accordance with a preferred embodiment, the filling is an adhesive having a coefficient of thermal expansion matched to the coefficient of thermal expansion of the contact clip and the semi-conductor body.

In accordance with again another feature of the invention, the baseplate comprises a copper layer supporting the semiconductor body and a ceramic substrate supporting the copper layer.

In accordance with again a further feature of the invention, the contact clip forms a large-area connection with the copper layer and/or the ceramic substrate at an end of the contact clip facing away from the semiconductor body so that the contact clip is heated only slightly above a temperature of the copper layer.

In accordance with a concomitant feature of the invention, during an operation of the power semiconductor component, the ceramic substrate assumes a temperature $T_1$, the contact clip assumes a temperature $T_3$, and the semiconductor body assumes a temperature $T_2$, and the temperatures are related by the expression:

$$T_2 \gg T_3 > T_1.$$

In other words, in the electrical connection according to the invention, the soldered-on contact clip and the semiconductor body of the actual power semiconductor component are thermally and mechanically decoupled. The electrical supply is no longer soldered over the entire area on the surface of the semiconductor body, but with the aid of the at least one solder land, possibly at a few small-area solder points, by means of the solder balls incorporated in the respective solder land. The connection between the solder point and the actual contact clip, namely the electrical supply to the solder point, is designed, for example, in a meandering shape and comprises a thin, flexible leg or strip, which is stamped together with the solder land out of the sheet metal of the contact clip and is bent downward into a plane that is located closer to the surface of the semiconductor body. The length and cross section of this electrical supply from the leg or strip are chosen such that the power loss remains low and such that there is only a small amount of heat dissipation between the semiconductor body and the contact clip through the electrical supply. The electrical conductivity and, above all, the thermal conductivity of the actual contact clip, which forms a connecting clip for the electrical supply via the solder land, are in contrast set to be sufficiently high that the connecting clip is heated only slightly above the temperature of a base plate, which is composed of a ceramic substrate and a copper layer, on which the semiconductor body is fitted. In this case, the temperature $T_1$ of the ceramic substrate, the temperature $T_3$ of the contact clip and the temperature $T_2$ of the semiconductor body are intended to be related by the above expression $T_2 \gg T_3 > T_1$.

In consequence, even if major temperature fluctuations occur, only extremely small thermomechanical stresses are produced between the electrical supply or the contact strip and the semiconductor body or the actual power semiconductor component. By additionally filling the area or the gap between the semiconductor body and the contact clip with a material, preferably an adhesive, whose coefficient of thermal expansion is matched with the coefficient of thermal expansion of the contact clip and of the semiconductor body, any relative movement can be absorbed elastically without deformation and fatigue at the solder points. The contact clip and the meandering electrical supply are produced from a tri-layer bimetallic sheet with a "symmetrical" layer sequence. Suitable layers are, for example, copper-Invar-copper. However, a molybdenum sheet may also be used instead of these layers. The solder lands, into which the soldered balls will later be incorporated, and the electrical supply to them can be formed from such a metal sheet by etching or laser cutting.

Other features which are considered as characteristic for the invention are set forth in the appended claims.

Although the invention is illustrated and described herein as embodied in an electrical connection for a power semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
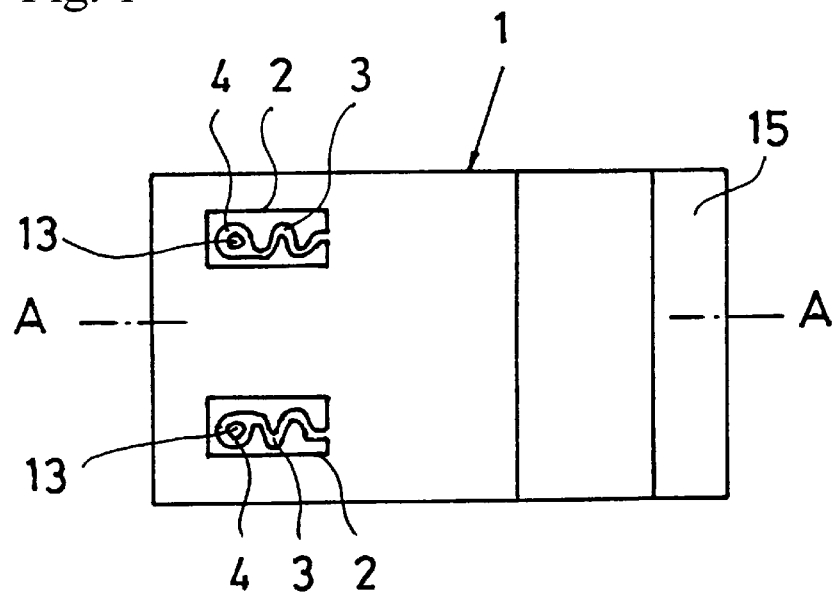
FIG. 1 is a plan view of a contact clip.

Referring now to the figures of the drawing in detail and first, particularly, to FIG. 1 thereof, there is seen a contact clip 1, from which, in regions 2, electrical supplies 3 to solder lands 4 are formed by etching or laser cutting.

Figure 2:
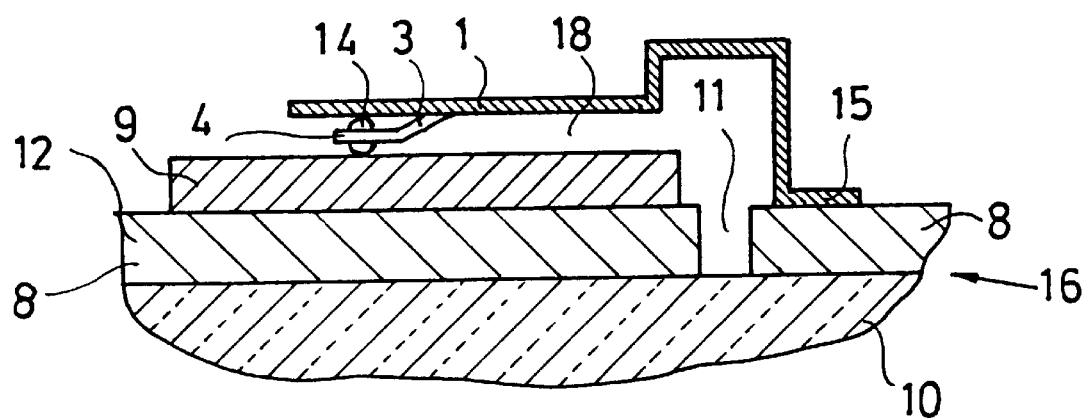
FIG. 2 is a partial section taken through the contact clip along the line II—II in FIG. 1, with the contact clip fitted on a power semiconductor component.

With reference to FIG. 2, the electrical supply 3 and the solder land 4 are located "underneath" the plane of the actual contact clip 1. This can be attained by an appropriate bending process after etching or laser cutting.

Figure 4:
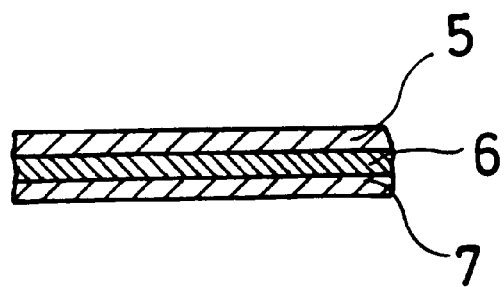
FIG. 4 is a partial sectional view showing a layer sequence for the contact clip.

The contact clip 1, which represents a connecting clip for the electrical supply 3, the electrical supply 3, and the solder land 4 are produced from the same material and are composed, for example, of molybdenum or they comprise a tri-layer bimetallic sheet with a symmetrical layer sequence. This avoids any bimetallic effect with bending to one side. One such exemplary layer sequence is shown in FIG. 4. The sequence comprises a copper layer 5, an Invar layer 6, and a further copper layer 7. Invar is chosen since it has a particularly low coefficient of thermal expansion.

Referring again to FIG. 2, the contact clip 1 is passed between a copper layer 8 and a semiconductor body 9. The copper layer 8 is applied, for example using the DCB technique (DCB=direct copper bonding), onto a ceramic substrate 10, preferably composed of aluminum oxide, and is interrupted by a gap 11. The "left-hand" part of the copper layer 8 thus forms an electrode 12 for the semiconductor body 9. The gap 11 may be produced, for example, by etching, once the copper layer 8 has been applied onto the ceramic substrate 10.

In the exemplary embodiment in FIGS. 1 and 2, two regions 2 are each provided with a solder land 4. A solder ball 14 is introduced into the opening 13 in the solder land 4 in order to make contact with the semiconductor body 9, so that there are two small-area solder points here.

The electrical supply 3 is designed in a meandering shape for strain relief. It forms a thin, flexible leg or strip, whose length and cross section are designed such that the power loss and heat dissipation from the semiconductor body 9 to the contact clip 1 remain low.

At its end 15 facing away from the semiconductor body 9, the contact clip 1 is connected to the copper layer 8, which is separated by the gap 11 from the electrode 12. The contact clip 1 can thereby be bent in a U-shape to provide further strain relief.

The ceramic substrate 10 and the copper layer 8 form a baseplate 16 for the semiconductor body 9 and the contact clip 1, that is to say for the actual power semiconductor component. The electrical conductivity and, above all, the thermal conductivity of the contact clip 1 to the copper layer 8 and to the baseplate 16 are chosen to be sufficiently high that the contact clip 1 is heated only slightly above the baseplate temperature and that a temperature $T_1$ of the baseplate 16 or of the copper layer 8 (in the region outside the electrode 12), a temperature $T_3$ of the contact clip 1 and a temperature $T_2$ of the semiconductor body are related by the following expression:

$$T_2 \gg T_3 > T_1.$$

As has already been mentioned above, two solder points are provided in the present exemplary embodiment.

However, more than two solder points and thus regions 2 with electrical supplies 3 and solder lands 4 can also be used. In special cases, even only one solder point is sufficient, provided the power loss in the single electrical supply remains sufficiently low.

Figure 3:
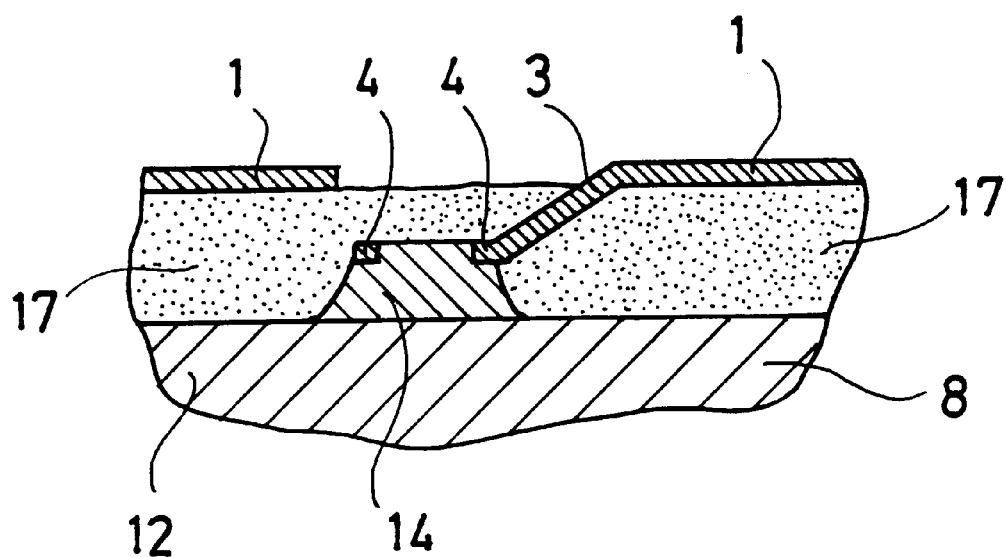
FIG. 3 is a partial section taken through the filling for the contact clip.

As FIG. 3 shows, a filling 17 can be introduced into the area 18 between the contact clip 1 and the semiconductor body 9. This filling 17 is composed of an adhesive whose coefficient of thermal expansion is matched to the coefficient of thermal expansion of the semiconductor body 9 and of the contact clip 1. One suitable adhesive, for example, is a conventional flipchip filler. This allows any relative movement to be absorbed elastically, without deformation and fatigue of the solder points.

The invention thus provides an electrical connection for a power semiconductor component, which exhibits virtually no material fatigue, particularly at the solder points or soldered joints, even after large numbers of alternating load cycles.

I claim:

1. An electrical connection for a power semiconductor component, comprising:
   a baseplate,
   a semiconductor body disposed on said baseplate, and
   a contact clip with a soldered joint connected to said semiconductor body; said soldered joint being formed as a small-area solder point between said semiconductor body and said contact clip; and said contact clip including at least one strain-relieving solder land, said at least one strain-relieving solder land defining an opening having a solder ball introduced into said opening, said solder ball forming said small-area solder point, whereby said contact clip and said semiconductor body are thermally and mechanically decoupled from one another.

2. The electrical connection according to claim 1, which comprises a meandering electrical supply connecting said strain-relieving solder land to said contact clip.

3. The electrical connection according to claim 2, wherein said electrical supply, said solder land, and said contact clip are formed from the same material.

4. The electrical connection according to claim 3, wherein said contact clip extends along a given plane, and said electrical supply and said solder land are formed in a plane closer to said semiconductor body than said given plane defined by said contact clip.

5. The electrical connection according to claim 1, wherein said contact clip is formed form a material selected from the group consisting of a tri-layer bimetallic sheet and molybdenum.

6. The electrical connection according to claim 1, wherein said contact clip is formed of a tri-layer bimetallic sheet with a layer sequence composed of materials A-B-A.

7. The electrical connection according to claim 6, wherein the material A is copper and the material B is Invar.

8. The electrical connection according to claim 1, which further comprises a filling between said contact clip and said semiconductor body.

9. The electrical connection according to claim 8, wherein said contact clip and said semiconductor body have a given coefficient of thermal expansion, and said filling is an adhesive having a coefficient of thermal expansion matched to the given coefficient of thermal expansion of said contact clip and said semi-conductor body.

10. The electrical connection according to claim 1, wherein said baseplate comprises a copper layer supporting said semiconductor body and a ceramic substrate supporting said copper layer.

11. The electrical connection according to claim 10, wherein said contact clip forms a large-area connection with at least one of said copper layer and said ceramic substrate at an end of said contact clip facing away from said semiconductor body so that said contact clip is heated at most slightly above a temperature of said copper layer.

12. The electrical connection according to claim 11, wherein, during an operation of the power semiconductor component, said ceramic substrate assumes a temperature $T_1$, said contact clip assumes a temperature $T_3$, and said semiconductor body assumes a temperature $T_2$, and the temperatures are related by the expression:

$$T_2 \gg T_3 > T_1.$$

13. An electrical connection for a power semiconductor component, comprising:
   a baseplate, a semiconductor body disposed on said baseplate, and a contact clip with a soldered joint connected to said semiconductor body;
   said soldered joint being formed as a small-area solder point between said semiconductor body and said contact clip;
   said contact clip including at least one strain-relieving solder land carrying said small-area solder point, whereby said contact clip and said semiconductor body are thermally and mechanically decoupled from one another; and
   said contact clip is formed of a trimetallic sheet with a layer sequence composed of materials copper-Invar-copper.

14. An electrical connection for a power semiconductor component, comprising:
   a baseplate;
   a semiconductor body disposed on said baseplate;
   a contact clip with a soldered joint connected to said semiconductor body,
      said soldered joint being formed as a small-area solder point between said semiconductor body and said contact clip, and
      said contact clip including at least one strain-relieving solder land carrying said small-area solder point, whereby said contact clip and said semiconductor body are thermally and mechanically decoupled from one another; and
   a filling between said contact clip and said semiconductor body.

15. An electrical connection for a power semiconductor component, comprising:
   a baseplate including a ceramic substrate supporting a copper layer;
   a semiconductor body supported by said copper layer; and
   a contact clip with a soldered joint connected to said semiconductor body;
   said soldered joint being formed as a small-area solder point between said semiconductor body and said contact clip;
   said contact clip including at least one strain-relieving solder land carrying said small-area solder point, whereby said contact clip and said semiconductor body are thermally and mechanically decoupled from one another; and
   said contact clip forming a large-area connection with at least one of said copper layer and said ceramic substrate at an end of said contact clip facing away from said semiconductor body so that said contact clip is heated at most slightly above a temperature of said copper layer.

16. The electrical connection according to claim 15, wherein, during an operation of the power semiconductor component, said ceramic substrate assumes a temperature $T_1$, said contact clip assumes a temperature $T_3$, and said semiconductor body assumes a temperature $T_2$, and the temperatures are related by the expression:

$$T_2 \gg T_3 > T_1.$$

* * * * *